(12) United States Patent
Kasturi

(10) Patent No.: US 9,728,912 B2
(45) Date of Patent: Aug. 8, 2017

(54) MICRO-COAX CABLE ADAPTOR BOARD

(71) Applicant: INTEL CORPORATION, Santa Clara, CA (US)

(72) Inventor: Vijay Kasturi, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/962,131

(22) Filed: Dec. 8, 2015

(65) Prior Publication Data

US 2017/0162987 A1    Jun. 8, 2017

(51) Int. Cl.
*H01R 9/05* (2006.01)
*H01R 24/50* (2011.01)
*H05K 1/02* (2006.01)

(52) U.S. Cl.
CPC ......... *H01R 24/50* (2013.01); *H05K 1/0298* (2013.01)

(58) Field of Classification Search
CPC .................................................. H01R 24/50
USPC ........... 439/63, 76.1, 77, 581, 579, 497, 493
See application file for complete search history.

(56) References Cited

U.S. PATENT DOCUMENTS

| | | | |
|---|---|---|---|
| 5,364,292 A * | 11/1994 | Bethurum | H01R 13/6599 439/607.02 |
| 5,980,308 A * | 11/1999 | Hu | H01R 12/598 439/497 |
| 6,336,827 B1 * | 1/2002 | Akama | H01R 12/62 174/261 |
| 6,371,805 B1 * | 4/2002 | Wang | H01R 9/0512 439/581 |
| 6,661,318 B2 * | 12/2003 | Tamaki | H01P 5/085 333/260 |
| 6,793,527 B2 * | 9/2004 | Noro | H01R 13/6592 439/497 |
| 6,927,655 B2 * | 8/2005 | Torigoe | G02B 6/4201 333/260 |
| 7,311,552 B1 * | 12/2007 | Ko | H01R 4/023 439/404 |
| 7,462,065 B1 * | 12/2008 | Zhao | H01R 12/592 439/497 |
| 7,637,779 B2 * | 12/2009 | Nagata | H01R 12/598 439/497 |
| 8,662,917 B2 * | 3/2014 | Wang | H01R 9/038 439/493 |
| 8,814,601 B1 * | 8/2014 | Sherrer | H01R 4/34 29/852 |
| 9,373,915 B1 * | 6/2016 | Schulz | H01R 13/6594 |
| 2006/0252310 A1 * | 11/2006 | Yamada | H01R 9/0512 439/579 |
| 2012/0252266 A1 * | 10/2012 | Ling | H01R 9/038 439/581 |
| 2014/0206230 A1 * | 7/2014 | Rost | H01R 9/032 439/607.01 |

* cited by examiner

*Primary Examiner* — Abdullah Riyami
*Assistant Examiner* — Nelson R Burgos-Guntin
(74) *Attorney, Agent, or Firm* — Schwabe, Williamson & Wyatt, P.C.

(57) ABSTRACT

An adaptor board may include a multi-layer circuit board having at least three layers, namely a first board layer, a second board layer, and a third board layer. A first plurality of cable contacts may be provided at the first board layer, and a second plurality of cable contacts may be provided at the third board layer.

20 Claims, 10 Drawing Sheets

MICRO-COAX CABLE ADAPTOR BOARD

BACKGROUND

1. Field

Embodiments may relate to a micro-coax cable adaptor board.

2. Background

Electronic cables may be used to carry electrical data signals and/or power from one electronic device to another electronic device. At some point the cable must be terminated where it connects to the device or to a plug or connector that may be plugged into the device. High speed electrical performance may depend on proper cable termination in order to insure mechanical and electrical integrity.

BRIEF DESCRIPTION OF THE DRAWINGS

Arrangements and embodiments may be described in detail with reference to the following drawings in which like reference numerals refer to like elements and wherein.

DETAILED DESCRIPTION

Arrangements and embodiments may be described with respect to a computer, such as a laptop computer or a notebook computer. Arrangements and embodiments may be applicable to other electronic devices, such as mobile terminals.

Embodiments may relate to routing a number of signal and/or power connections across a hinge (or hinge device) in an electronic system or electronic device, such as a laptop, a notebook computer, for example. Embodiments may also relate to routing signal and/or power connections between different circuit boards and/or different electronic components.

As one example, touch screens, cameras, high-speed displays, and sensors may use an increased number of signals that need to be routed across a hinge and/or routed between different electrical components.

Embodiments may provide a cabling solution across a hinge that may consume less board area as compared to disadvantageous arrangements.

Embodiments may support a larger number of signals and/or signal lines across a single connector (or hinge), while simultaneously consuming less board real-estate.

Embodiments may relate to a high-density, high-speed flexible printed circuit board (FPC) to micro-coax adaptor (or adaptor board) that may connect a high-density, high-pin-count and tight-pitch FPC connector on a circuit board (such as a mother circuit board) to low loss micro-coax cables to support cabling across a hinge, for example. Embodiments may increase a maximum density without sacrificing high-speed performance by utilizing both surfaces (top and bottom) of an adaptor board (or connector board) to provide a controlled impedance transition from an FPC to a micro-coax cable.

Figure 1:
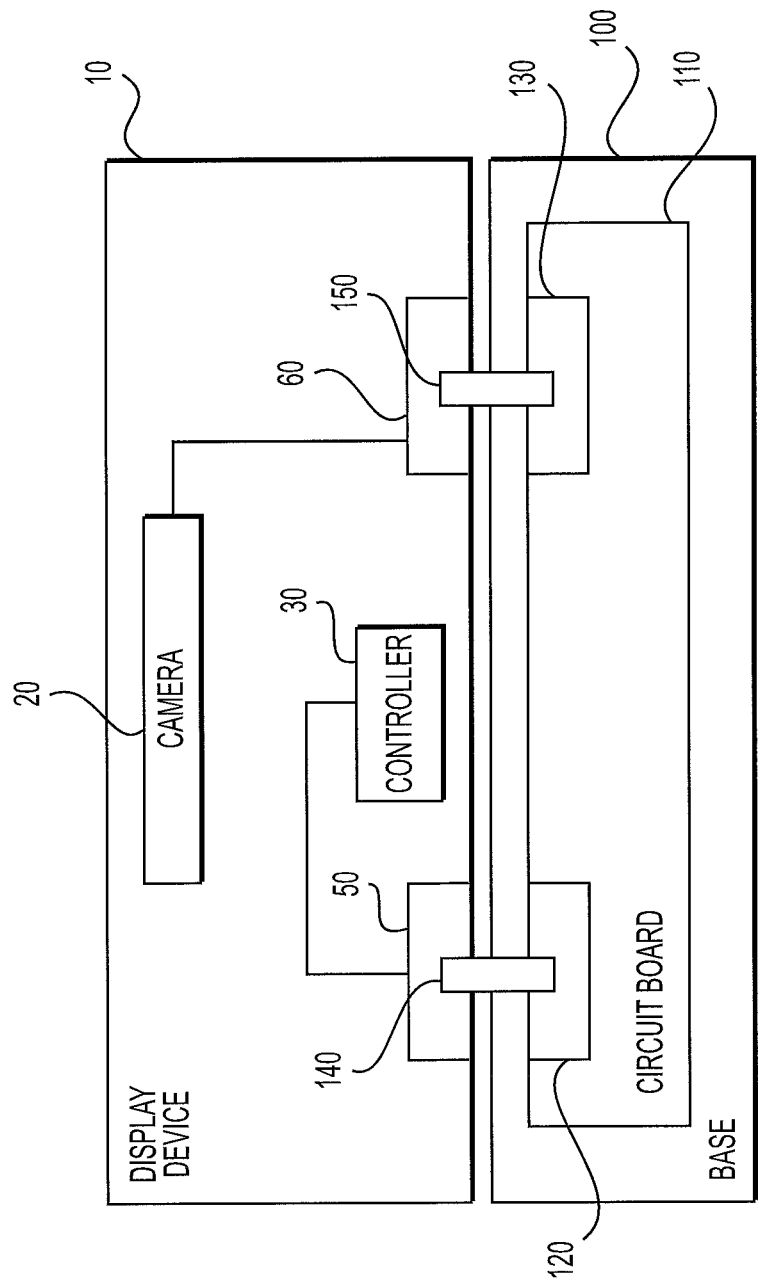
FIG. 1 shows an electronic system according to an example arrangement.

FIG. 1 shows an electronic system according to an example arrangement. Other arrangements may also be provided.

FIG. 1 shows an electronic system (or electronic apparatus) that may include a display device 10 and a base 100 that are coupled by hinges (or hinge devices). The display device 10 may be a first part (of an electronic system) having at least one electronic component. The first part may be a lid having a display (or display device). The base 100 may be a second part of the electronic system. As will be described below, the second part may have a circuit board and a connector (at the circuit board).

The display device 10 may be a liquid crystal display, for example. The display device 10 may include a camera 20 (or camera module), a controller 30, a first hinge 50 (or hinge device) and a second hinge 60 (or hinge device). These components are shown merely as examples, as other components may also be provided within the electronic system. For example, the display device 10 may include a touch controller, an infrared sensor and other types of sensors. The hinge (or hinge device) may couple the first part (or display device) to the second part (or base).

Data, information and power may be communicated across the hinges. For example, data from the camera 20 (or other components) may be provided across the second hinge 60 to the base 100, and/or data from the controller 30 may be provided across the first hinge 50 to the base 100.

The base 100 may include a circuit board 110 that may include numerous components, such as a processor, a controller, a battery, etc. The circuit board 110 may also be referred to as a motherboard or a flexible printed circuit board (FPCB).

FIG. 1 also shows a first flexible printed circuit (FPC) connector 120 attached (or mounted) to the circuit board 110, and a second FPC connector 130 attached (or mounted) to the circuit board 110.

A first micro-coax cable system 140 may provide a cable connection across the first hinge 50 and to the first FPC connector 120. A second micro-coax cable system 150 may provide a cable connection across the second hinge 60 and to the second FPC connector 130. The first micro-coax cable system 140 may include one or more micro-coax cables. The second micro-coax cable system 150 may include one or more micro-coax cables.

Data and information may be communicated between the controller 30 (or other components) and the circuit board 110 by use of the first hinge 50, the first micro-coax cable system 140 and the first FPC connector 120. Data and information may be communicated between the camera 20 (or other components) and the circuit board 110 by use of the second hinge 60, the second micro-coax cable system 150 and the second FPC connector 130. However, due to a large amount of data and information to be communicated, a large number of connector pins and/or a larger amount of board area may be needed for the cable systems 140, 150 and the first/second hinges 50, 60.

Figure 2:
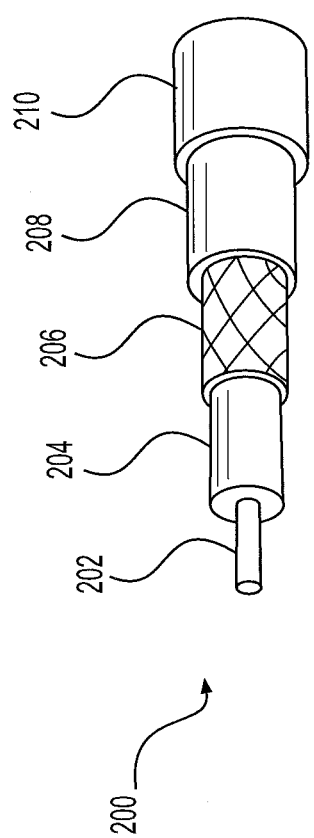
FIG. 2 is a view of a micro-coax cable according to an example arrangement.

FIG. 2 is a view of a micro-coax cable according to an example arrangement. Other arrangements may be provided. An electronic system may include a plurality of micro-coax cables.

FIG. 2 shows a micro-coaxial cable, commonly referred to as micro-coax. A micro-coax cable 200 may include a central signal wire 202 (or wire) covered in a signal wire insulator 204, a conductive coaxial shield 206 surrounding the insulator 204, a shield insulator 208 and an outer insulated sheath 210. The cables may be, provided in differential pairs with one signal wire 202 carrying signal Ss+ and another signal wire carrying signal Ss−.

In this arrangement, the micro-coax cable is to connect to an adaptor board, such as a printed circuit board (PCB).

In order to make a cable termination at an adaptor board (such as a PCB) the wire 202 may be soldered to a contact of a printed circuit board (PCB). The contact may also be referred to as a terminal or a pad. A portion of the wire 202 may be soldered onto PCB contacts, for example. A plurality of contacts (or pads) may be arranged in a row on the PCB. An additional metal ground bar may be used to tie the cable shield to the ground.

Figure 3A:
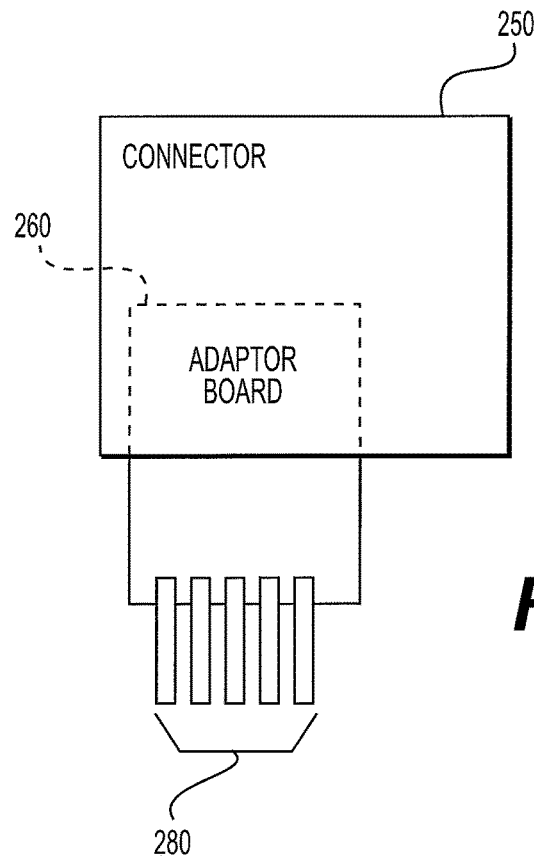
FIG. 3A is a top view of connector system according to an example arrangement.
Figure 3B:
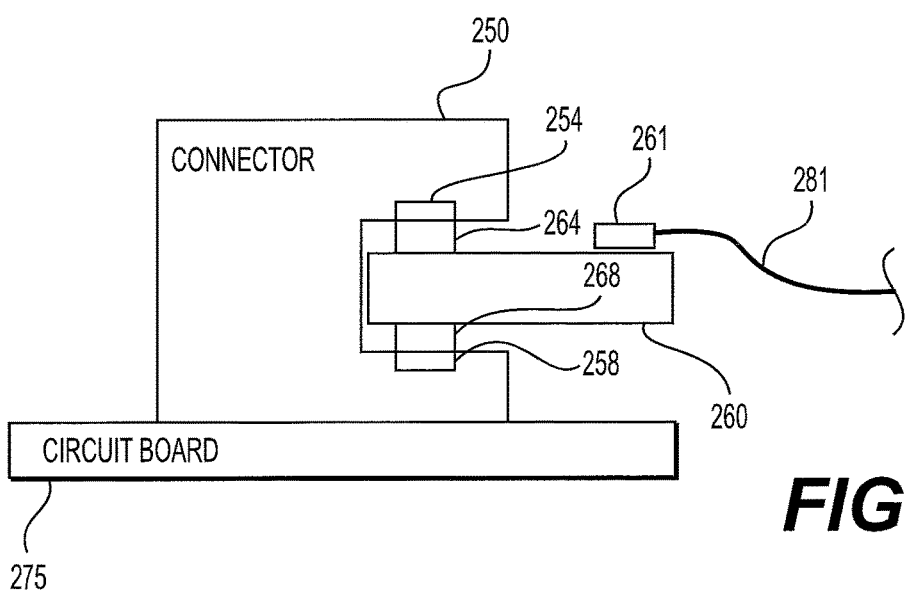
FIG. 3B is a side view of a connector system according to an example arrangement.

FIG. 3A is a top view of a connector system according to an example arrangement. FIG. 3B is a side view of a connector system according to an example arrangement. Other arrangements may also be provided. In this arrangement, the connector system may include a flexible printed circuit (FPC) connector, an adaptor board and one or more micro-coax cables.

FIG. 3A is a top view showing a flexible printed circuit (FPC) connector 250 and an adaptor board 260 that is physically connected to the FPC connector 250. While FIG. 3A shows a single adaptor board 260, other numbers of adaptor boards may be connected to a single FPC connector. The connector 250 is a micro-coax receptacle that receives the adaptor boards (or plug assemblies). The adaptor board(s) may connect to a plurality of micro-coax cables that extend outward from the adaptor board(s).

The adaptor board 260 may be a printed circuit board having a single layer L1. The adaptor board 260 shown in FIGS. 3A and 3B is a single layered adaptor board. Traces may be provided on the adaptor board to communicate from a first end of the board to a second end of the board.

FIG. 3B is a side view showing the FPC connector 250 mounted (or attached) to a circuit board 275. The circuit board 275 may correspond to the circuit board 110 shown in FIG. 1.

The adaptor board 260 may be separately and independently called a connector board, a circuit board or a plug assembly. Each adaptor board may provide a connection between one or more cables (or wires) and the FPC connector 250. This may allow data, information and power to be provided between two separate electrical components. For example, if the micro-coax cable is provided as the cable system in FIG. 1, then data, information and power may be provided between the base 100 and the display device 10.

The adaptor board 260 may be mounted and/or attached to the connector 250 in order to provide a proper connection for data, information and power. The adaptor board 260 may be physically received at (or within) an opening on a side of the connector 250. The connector 250 may include connector contacts at the opening of the connector 250 to physically connect to connector contacts (or board contacts) at the adaptor board 260.

The adaptor board 260 may include a plurality of connector contacts to physically connect to (or contact) a plurality of connector contacts at the connector 250. The connector contacts may be at (or on) a top surface of the adaptor board (such as the adaptor board 260) and/or the connector contacts may be at (or on) a bottom surface of the adaptor board (such as the adaptor board 260). The connector contacts may also be referred to as board contacts, terminals or pads.

The micro-coax cables may electrically connect to cable contacts (or board contacts) at a cable end of the adaptor board 260. FIG. 3B only shows a single cable contact 261 at the top surface of the adaptor board 260 (at the cable end), although a plurality of cable contacts may be provided at the top surface.

FIG. 3A shows a first plurality 280 of micro-coax cables connected to and extending from a top surface of the adaptor board 260.

In at least one embodiment, the first plurality 280 of micro-coax cables may be provided through a hinge of an electronic system. For example, the first plurality 280 of micro-coax cables may be provided through the first hinge 50 of the electronic system (of FIG. 1) to provide data, information and power between the base 100 and the display device 10. In at least one embodiment, the other end of the first plurality 280 of the micro-coax cables may be connected to another FPC connector.

In at least one embodiment, the first plurality 280 of micro-coax cables may extend to other components of an electronic system or electronic device.

FIG. 3B is a side view that shows only one coax cable 281 (of the first plurality 280 of micro-coax cables) being physically connected to a cable contact at a top surface of the adaptor board 260. The cable contact 261 is at the cable end of the adaptor board 260. Although not shown, other ones of the first plurality 280 of micro-coax cables may by physically connected to other cable contacts at the top surface of the adaptor board 260 (at the cable end).

FIG. 3B also shows a first connector contact 264 at a top surface of the adaptor board 260, and a second connector contact 268 at a bottom surface of the adaptor board 260. The first and second connector contacts 264, 268 are provided at a connector end of the adaptor board 260. FIG. 3B also shows a first connector contact 254 at a top surface of the opening of the connector 250, and a second connector contact 258 at a bottom surface of the opening of the connector 250. When the adaptor board 260 is physically provided at (or in) the opening of the connector 250, then the first connector contact 264 may physically contact the first connector contact 254, and the second connector contact 268 may physically contact the second connector contact 258.

A plurality of first connector contacts may be provided at (or on) the top surface of the adaptor board 260. Alternatively, a plurality of second connector contacts may be provided at (or on) the bottom surface of the adaptor board 260. When the adaptor board 260 is physically provided at (or in) the opening of the connector 250, then the plurality of first connector contacts (at the adaptor board) may physically contact a plurality of first connector contacts (at the top surface of the opening), and the plurality of second connector contacts (at the adaptor board) may physically contact a plurality of second connector contacts (at the bottom surface of the opening). The connection of the cable 281 to the cable contact 261 and the connection of the first connector contact 264 to the first connector contact 254 and/or the connection of the second connector contact 268 to the second connector contact 258 allows communication between the FPC connector 250 and the corresponding micro-coax cable.

Figure 4:
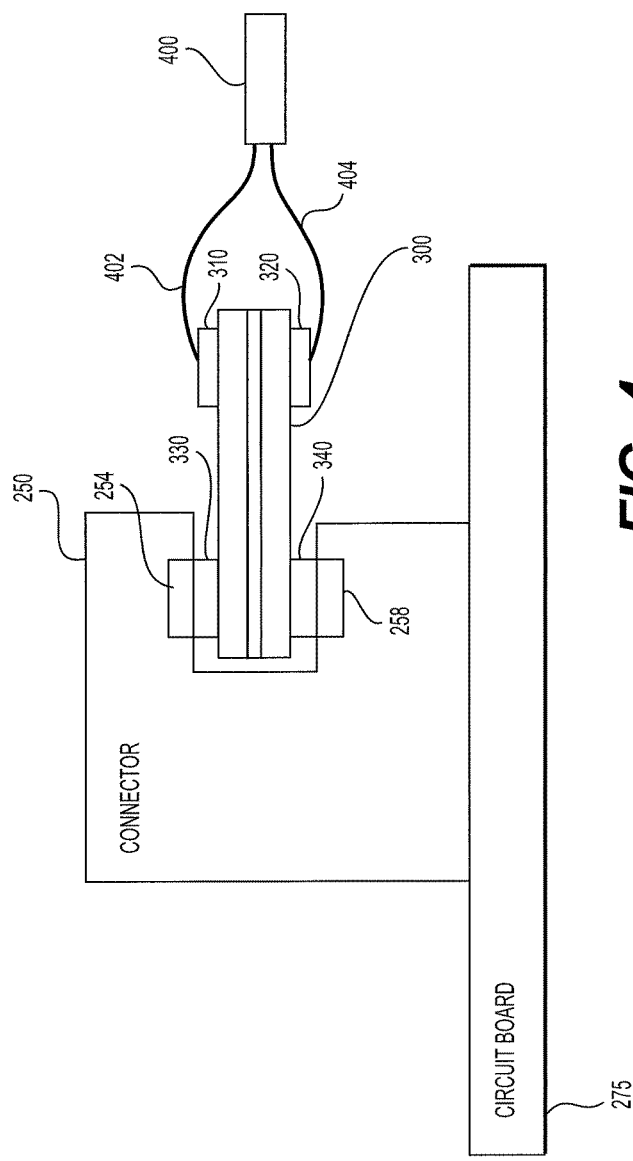
FIG. 4 is a side view of a connector system according to an example embodiment.

FIG. 4 is a side view of a connector system according to an example embodiment. Other embodiments and configurations may also be provided. In this embodiment, the connector system may include a flexible printed circuit (FPC) connector (or connector), a multi-layered adaptor board and a micro-coax cable system. The connector system may connect between a circuit board and another component, such as a hinge or a second circuit board.

FIG. 4 shows the FPC connector 250 and a multi-layered adaptor board 300 that is physically connected to the FPC connector 250. FIG. 4 also shows a micro-coax system 400 that connects to the adaptor board 300. In at least one embodiment, the micro-coax system 400 may pass through a hinge (or hinge device) to another component of an electronic system or electronic device/apparatus. In at least one embodiment, the micro-coax system 400 may connect to an electric component.

The adaptor board 300 includes a cable end (at the end that contacts a cable) and a connector end (at the end that contacts a connector). The cable end of the adaptor board may be called a first end, and the connector end of the adaptor board may be called a second end.

Figure 5:
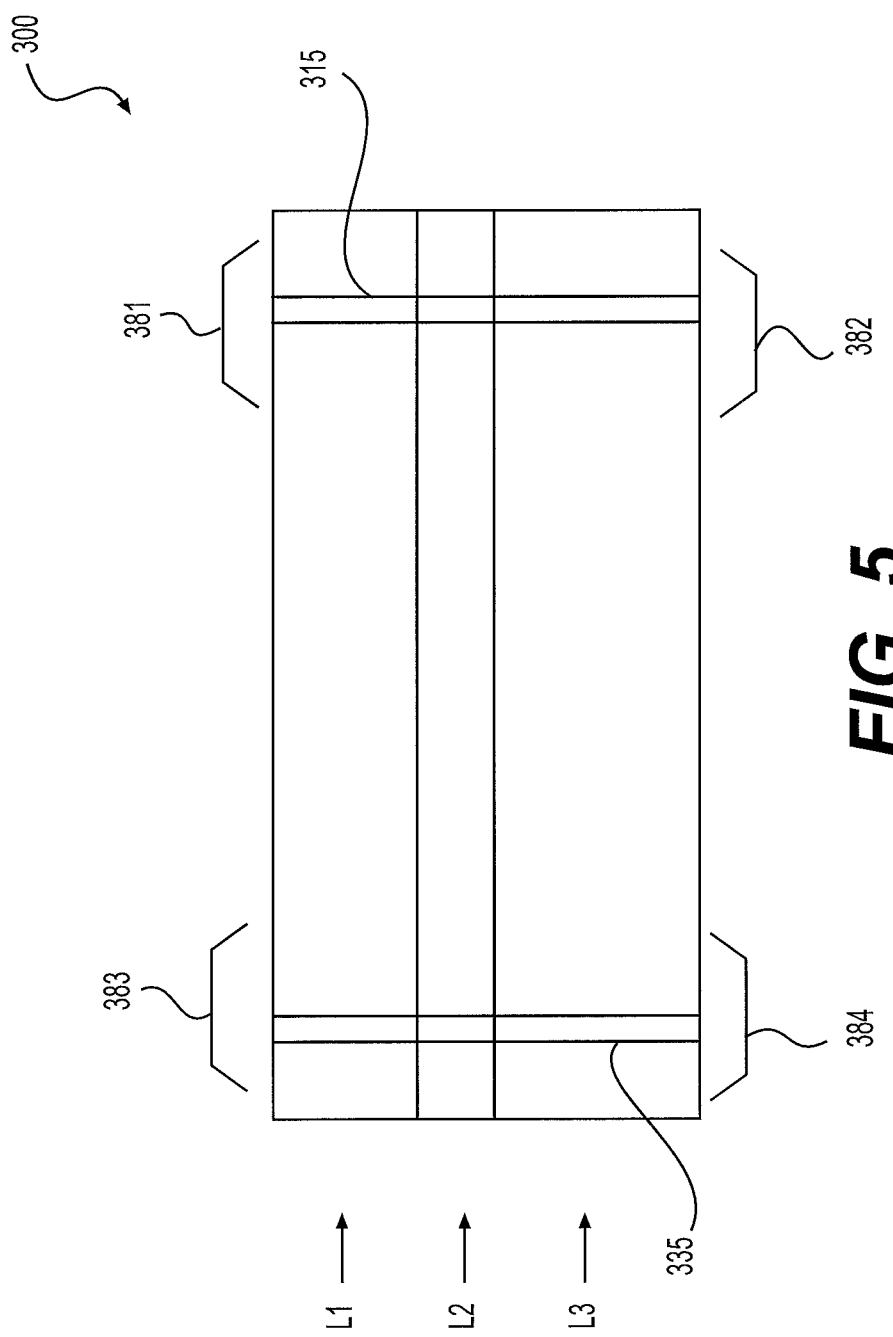
FIG. 5 is a side view of an adaptor board according to an example embodiment.

The adaptor board 300 may be a three-layered circuit board (or a multi-layered circuit board). However, other numbers of layers may also be provided. FIG. 5 is a side view of a three-layered circuit board. The circuit board may include a first board layer L1 (at a top of the circuit board), a second board layer L2 under the first board layer L1, and a third board layer L3 (at a bottom of the circuit board) under the second board layer L2. The second board layer L2 may be between the first board layer L1 and the third board layer.

A plurality of traces (or signal traces) may be provided at the top of first board layer L1 to communicate between a first end of the adaptor board and a second end of the adaptor board. A plurality of traces (or signal traces) may be provided at the bottom of third board layer L3 to communicate between a first end of the adaptor board and a second end of the adaptor board. Additionally, vias may be provided between the first board layer L1 and the third board layer L3.

A first plurality of cable contacts may be at the first board layer L1, and a first plurality of connector contacts may be at the first board layer L1. A second plurality of cable contacts may be at the third board layer L3, and a second plurality of connector contacts may be at the third board layer L3.

FIG. 4 shows the FPC connector 250 mounted or attached to the circuit board 275. The circuit board 275 may correspond to the circuit board 110 shown in the electronic system of FIG. 1.

FIG. 4 only shows one adaptor board 300 physically connected to the connector 250. In at least one embodiment, a plurality of adaptor boards may be physically connected to the connector 250. However, for ease of description, only one adaptor board 300 is shown.

The adaptor board 300 may provide a physical and electrical connection between a micro-coax cable and the FPC connector 250. This may allow data, information and power to be provided between two separate electrical components. For example, if the micro-coax cable system is provided as the cable system in FIG. 1, then data, information and power may be provided between the base 100 and the display device 10.

The adaptor board 300 may be mounted and/or attached to the connector 250 in order to provide a proper connection for data, information and power. The adaptor board 300 may be physically received at (or within) an opening at a side of the connector 250. As stated above, connector contacts may be provided at the opening of the connector 250 to physically contact the adaptor board 300.

The adaptor board 300 may have a plurality of cable contacts at a cable end (i.e., right side of FIG. 4) of the adaptor board 300 to physically connect to (or contact) a plurality of micro-coax cables (or a plurality of wires). The cable contacts may be at a top (or top surface) of the adaptor board 300 and/or the cable contacts may be at a bottom (or bottom surface) of the adaptor board 300. FIG. 4 shows a cable contact 310 (or first contact) at a top surface of the adaptor board 300 (at the cable end), and a cable contact 320 (or second contact) at a bottom surface of the adaptor board 300 (at the cable end). Other contacts at the cable end are not shown in FIG. 4.

The adaptor board 300 may have a plurality of connector contacts (or board contacts) at a connector end (i.e., left side of FIG. 4) of the adaptor board 300 to physically connect to (or contact) a plurality of connector contacts at the connector 250. The connector contacts may be at a top (or top surface) of the adaptor board 300 and/or the connector contacts may be at a bottom (or bottom surface) of the adaptor board 300. FIG. 4 shows a connector contact 330 (or board contact) at a top surface of the adaptor board 300 (at the connector end), and a connector contact 340 (or board contact) at a bottom surface of the adaptor board 300 (at the connector end).

A plurality of micro-coax cables may attach at a top (or top surface) of the adaptor board 300 (at right side of FIG. 4). Additionally, a plurality of micro-coax cables may attach at a bottom (or bottom surface) of the adaptor board 300 (at right side of FIG. 4). The micro-coax cables (or wires) may physically connect to (or contact) the cable contacts at both the top surface of the adaptor board 300 and the bottom surface of the adaptor board 300. By connecting to cable contacts at both the top surface and the bottom surface of the adaptor board 300, more data, information and power may pass through the connector system.

FIG. 4 shows the micro-coax cable system 400 includes at least a first micro-coax cable 402 (or wire) and a second micro-coax cable 404 (or wire) that are to physically connect to cable contacts (or terminals) of the adaptor board 300. The micro-coax cable system 400 may include a plurality of micro-coax cables (or wires) that may physically connect to different cable contacts of the adaptor board 300 at both the top surface and bottom surface of the adaptor board 300 (at the cable end).

In at least one embodiment, the micro-coax cable system 400 may be provided through a hinge of an electronic system or electronic device. For example, the micro-coax cable system 400 may be provided through the first hinge 50 of the electronic system (of FIG. 1) to provide data, information and power between the base 100 and the display device 10. In at least one embodiment, the other end of the micro-coax cable system may connect to another FPC connector. In at least one embodiment, the other end of the micro-coax cable system may extend to other components of an electronic system or electronic device.

FIG. 4 shows the first micro-coax cable 402 (or wire) is physically connected to (or contacts) the cable contact 310 at the top surface of the adaptor board 300, and the second micro-coax 404 (or wire) is physically connected to (or contacts) the cable contact 320 at the bottom surface of the adaptor board 300. Although not shown in FIG. 4, a first plurality of cable contacts may be provided at the top surface of the adaptor board 300, and a second plurality of cable contacts may be provided at the bottom surface of the adaptor board 300. Other micro-coax cables (of the micro-coax cable system 400) may connect to cable contacts at the top surface of the adaptor board 300, and other micro-coax cables (of the micro-coax cable system 400) may connect to cable contacts at the bottom surface of the adaptor board 300.

The first micro-coax cable 402 may be a wire, which is part of the micro-coax cable. The second micro-coax cable 404 may be a wire, which is part of a micro-coax cable.

FIG. 4 also shows the first connector contact 330 at a top (or top surface) of the adaptor board 300 (at the connector end), and the second connector contact 340 at a bottom (or bottom surface) of the adaptor board 300. When the adaptor board 300 is provided at the opening of the connector 250, then the first connector contact 330 may physically connect to (or contact) the first connector contact 254 (at the top of the opening of the connector 250), and the second connector contact 340 may physically connect to (or contact) the second connector contact 258 (at the bottom surface of the opening of the connector 250).

A first plurality of connector contacts (or board contacts) may be provided at the top surface of the adaptor board 300 to physically connect to (or contact) a first plurality of connector contacts (at the top of the opening). A second plurality of connector contacts (or board contacts) may be provided at the bottom surface of the adaptor board 300 to physically connect to (or contact) a second plurality of connector contacts (at the bottom surface of the opening). One of the first plurality of cable contacts to contact a first contact at the connector 250, and one of the second plurality of connector contacts to contact a second contact at the connector 250. For example, the first plurality of connector contacts corresponding to the first plurality of traces (at the first board layer) may contact the contacts at a first connector module (at the connector 250). Additionally, the second plurality of connector contacts corresponding to the second plurality of traces (at the third board layer) may contact the contacts at a second connector module (at the connector 250).

FIG. 5 is a side view of the adaptor board 300 according to an example embodiment. Other embodiments and configurations may also be provided.

FIG. 5 shows three board layers of the adaptor board 300, namely first board layer L1, second board layer L2 and third board layer L3. FIG. 5 shows the second board layer L2 under the first board layer L1, and the third board layer L3 under the second board layer L2. The second board layer L2 is between the first board layer L1 and the third board layer.

A plurality of traces (or signal lines) may be provided at (or on) the top surface (or top) of the first board layer L1 of the adaptor board 300. The traces may allow signaling between opposite ends of the adaptor board 300 at the top (or on the top) of the first board layer L1.

Second board layer L2 may be a ground layer between first board layer L1 and third board layer L3.

A plurality of traces (or signal lines) may be provided at (or on) the bottom surface (or bottom) of the third board layer L3 of the adaptor board 300. The traces may allow signaling between opposite ends of the adaptor board 300 at the bottom (or on the bottom) of the third board layer L3.

FIG. 5 shows a first cable transition area 381 at the top of the adaptor board 300 (at the cable end), and a second cable transition area 382 at the bottom of the adaptor board 300 (at the cable end). The first cable transition area 381 and the second cable transition area 382 are both provided at the right end (or cable end) of the adaptor board 300.

FIG. 5 also shows a first connector transition area 383 at the top of the adaptor board 300 (at the connector end), and a second connector transition area 384 at the bottom of the adaptor board 300 (at the connector end). The first connector transition area 383 and the second connector transition area 384 are both provided at the left end (or connector end) of the adaptor board 300 shown in FIG. 5.

The first cable transition area 381 is an area where micro-coax cables connect to cable contacts at the first board layer L1 of the adaptor board 300 (i.e., at a top surface). The second cable transition area 382 is an area where micro-coax cables connect to cable contacts at the third board layer L3 of the adaptor board 300 (i.e., at a bottom surface).

The first connector transition area 383 is an area where connector contacts (or board contacts) at the first board layer L1 may connect to connector contacts of the FPC connector 250 (i.e., at a top surface). The second connector transition area 384 is an area where connector contacts (or board contacts) at the third board layer L3 may connect to connector contacts of the FPC connector 250 (i.e., at a bottom surface).

FIG. 5 also shows vias provided between layers of the adaptor board 300. For example, FIG. 5 shows a via 315 that connects a cable contact at the first cable transition area 381 to a cable contact at the second cable transition area 382. FIG. 5 also shows a via 335 that connects a connector contact at the first connector transition area 383 to a connector contact at the second connector transition area 384. The above described vias 315, 335 are merely examples, as other vias may also be provided. For example, a via may be provided between one of the traces at the first board layer and one of the traces at the third board layer.

FIG. 5 shows that the via 315 passes through first board layer L1, second board layer L2 and third board layer L3. FIG. 5 also shows that the via 335 passes through first board layer L1, second board layer L2 and third board layer L3. The vias allow data, information and power to pass from contacts at the top of the adaptor board 300 to contacts at the bottom of the adaptor board 300, or vice versa.

Figure 6A:
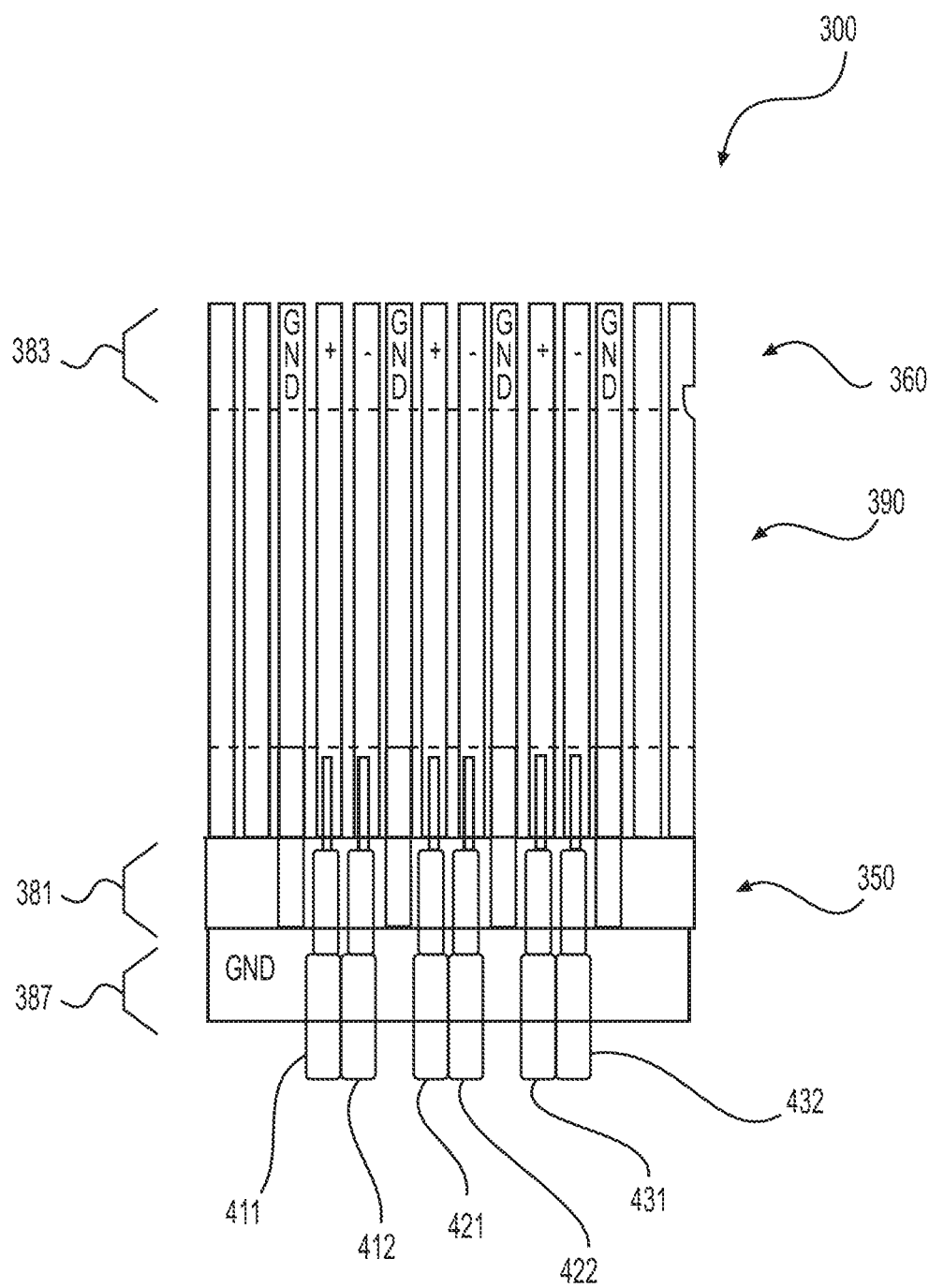
FIG. 6A shows a top surface of an adaptor board according to an example embodiment.
Figure 6B:
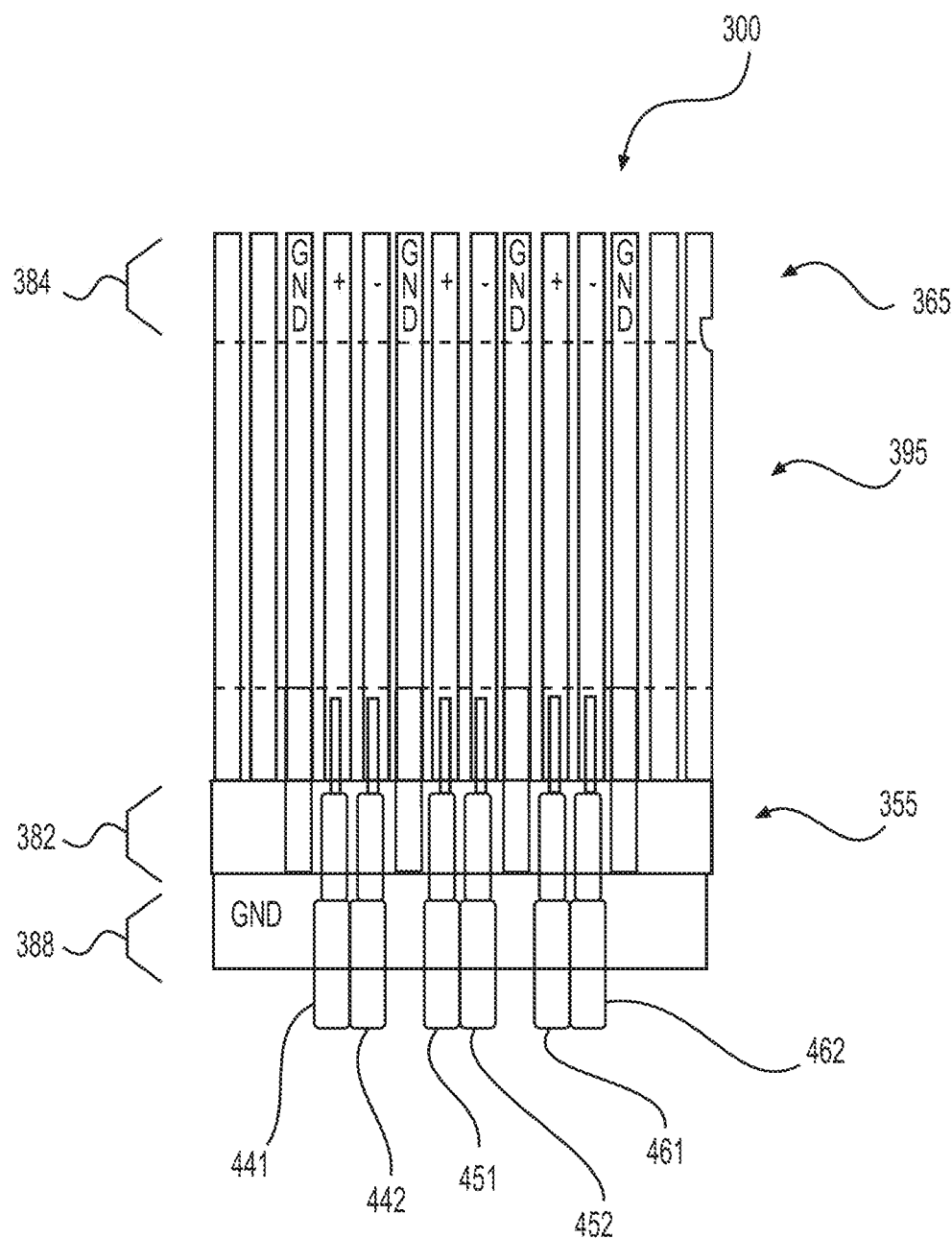
FIG. 6B shows a bottom surface of an adaptor board according to an example embodiment.
Figure 6C:
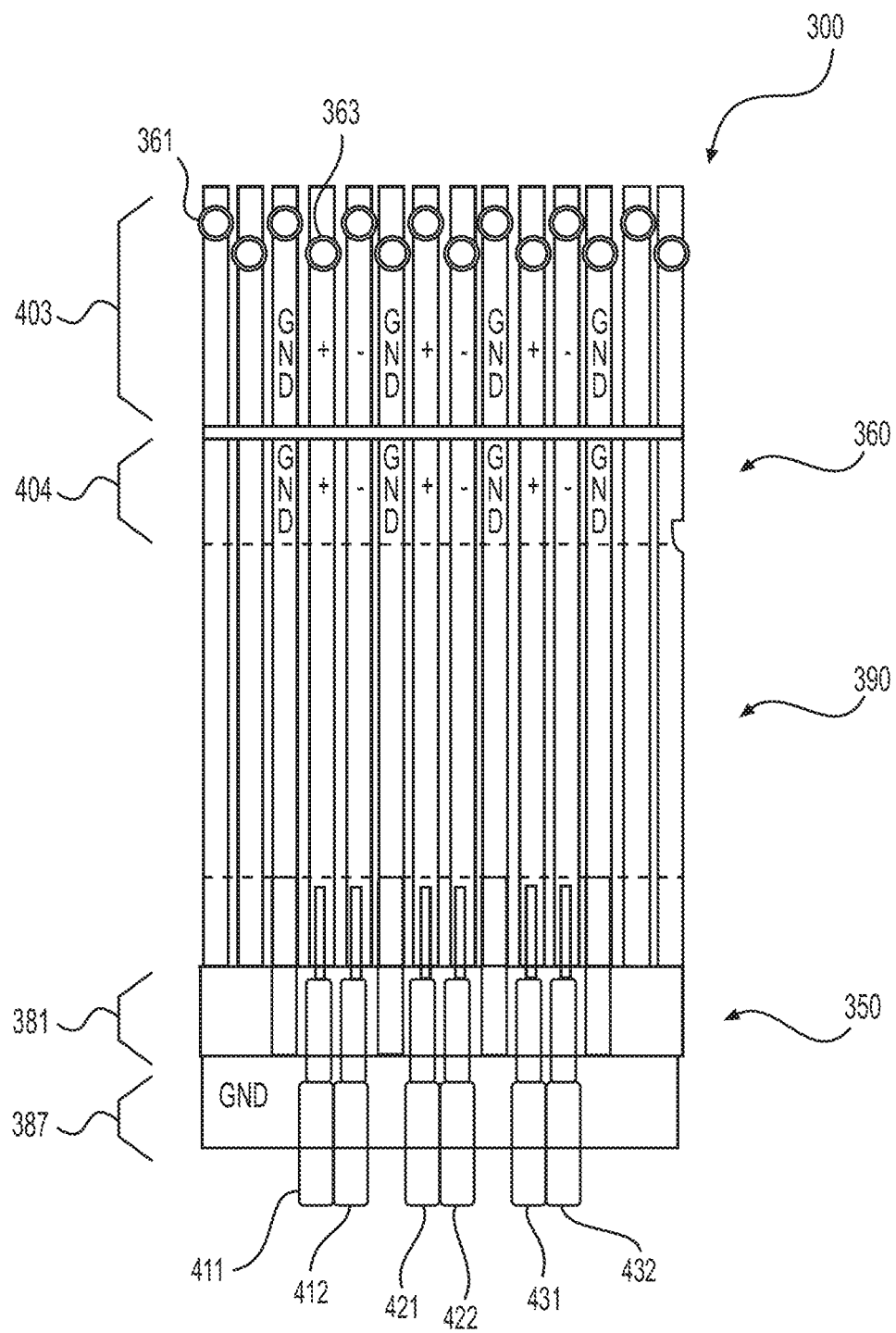
FIG. 6C shows a top surface of an adaptor board according to an example embodiment.

FIG. 6A shows a top surface of an adaptor board according to an example embodiment. FIG. 6B shows a bottom surface of an adaptor board according to an example embodiment. FIG. 6C shows a top surface of an adaptor board according to an example embodiment. Other embodiments and configurations may also be provided.

FIG. 6A shows different areas of the top surface of the adaptor board 300, namely the first cable transition area 381, the first connector transition area 383 and a ground area 387.

A first plurality of cable contacts 350 may be provided at the first cable transition area 381. A first plurality of connector contacts 360 may be provided at the first connector transition area 383. The first plurality of cable contacts 350 may include the cable contact 310 shown in FIG. 4. The first plurality of connector contacts 360 may include the connector contact 330 shown in FIG. 4.

FIG. 6A shows a plurality of traces 390 between the first cable transition area 381 (at a first end) and the first connector transition area 383 (at a second end). The plurality of traces 390 may be provided between the cable contacts 350 and the connector contacts 360. Each trace may be associated with a separate cable contact and a separate connector contact.

FIG. 6A shows a plurality of micro-coax cables connected to the adaptor board 300 at the first cable transition area 381. For example, FIG. 6A shows differential cables 411, 412 connected to two cable contacts (on the adaptor board 300) at the first cable transition area 381, differential cables 421, 422 connected to two cable contacts (on the adaptor board 300) at the first cable transition area 381 and differential cables 431, 432 connected to two cable contacts (on the adaptor board 300) at the first cable transition area 381.

Data, information and power may be provided (based on signals) from the cables 411, 412, 421, 422, 431, 432 to the adaptor board 300 at the first cable transition area 381. Signals may be provided from cables (or wires) to cable contacts and then across corresponding traces to connector contacts at the first connector transition area 383 (at the other end of the adaptor board 300).

FIG. 6A shows connector contacts 360 (or pads) at the first connector transition area 383. Each connector contact at the first connector transition area 383 may be associated with a different trace of the first board layer L1. Each connector contact at the first connector transition area 383 may physically connect to a different connector contact on the FPC connector 250 or to a via that communicates with a contact at the bottom surface of the adaptor board 300 (in the second connector transition area 384).

FIG. 6B shows different areas of the bottom surface of the adaptor board 300, namely the second cable transition area 382, the second connector transition area 384 and a ground area 388.

A plurality of cable contacts 355 may be provided at the second cable transition area 382. A plurality of connector contacts 365 may be provided at the second connector transition area 384. The plurality of cable contacts 355 may include the cable contact 320 shown in FIG. 4. The plurality of connector contacts 365 may include the connector contact 340 shown in FIG. 4.

FIG. 6B shows a plurality of traces 395 between the second cable transition area 382 (at a first end) and the second connector transition area 384 (at a second end). The plurality of traces 395 may be provided between the cable contacts 355 and the connector contacts 365. Each trace may be associated with a separate cable contact and a separate connector contact.

FIG. 6B shows a plurality of micro-coax cables connected to the adaptor board 300 at the second cable transition area 382. For example, FIG. 6B shows differential cables 441, 442 connected to two cable contacts (on the adaptor board 300) at the second cable transition area 382, differential cables 451, 452 connected to two cable contacts (on the adaptor board 300) at the second cable transition area 382 and differential cables 461, 462 connected to two cable contacts (on the adaptor board 300) at the second cable transition area 382.

Data, information and power may be provided (based on signals) from the cables 441, 442, 451, 452, 461, 462 to the adaptor board 300 at the second cable transition area 382. Signals may be provided from cables (or wires) to cable contacts and then across corresponding traces to connector contacts at the second connection transition area 384 (at the other end of the adaptor board 300).

FIG. 6B shows connector contacts 365 (or pads) at the second connector transition area 384. Each connector contact at the second connector transition area 384 may be associated with a different trace of the third board layer L3. Each connector contact at the second connector transition area 384 may physically connect to a different connector contact on the FPC connector 250 or to a via that communicates with a contact at the top surface of the adaptor board 300 (in the first connector transition area 383).

FIG. 6C is a top view of the first board layer L1. FIG. 6C shows a plurality of vias that are provided at the adaptor board 300.

FIG. 6C shows a first contact area 403 and a second contact area 404. The first contact area 403 includes a plurality of vias that communicate with contacts or traces at the third board layer L3. Each via may be associated with a different trace at the third board layer L3. Each via may communicate with a contact at the bottom surface of the adaptor board 300 (in the second connector transition area 384). Each via at the first contact area 403 may be (or be attached to) a connector contact (or connector pad) to contact the corresponding connector contact at the connector 250.

The second contact area 404 may correspond to the first connector transition area 383 shown in FIG. 6A. The second contact area 404 may include the plurality of connector contacts 360.

FIG. 6C shows a via 361 at a top surface of the adaptor board. The via 361 may contact a corresponding one of the connector contacts of the connector 250. The via 361 may be associated with a first trace at the third board layer L3 (of the adaptor board 300). FIG. 6C shows a via 363 at a top surface of the adaptor board. The via 363 may contact a corresponding one of the connector contacts of the connector 250. The via 363 may be associated with a fourth trace at the third board layer L3 (of the adaptor board 300).

As shown in FIG. 6C, the first trace on the board layer L1 of the adaptor board 300 is not connected to a specific micro-coax cable. In this embodiment, the via 361 may be connected to a first trace at the third board layer L3 of the adaptor board 300. For example, the via 361 may pass from the first board layer L1 to the third board layer L3 (at an area corresponding to the first trace). The first trace at the third board layer L3 may extend to a cable contact at the second cable transition area 382. A micro-coax cable may contact a cable contact at the second cable transition area 382. Accordingly, communication may be provided from the cable (or wire) at the cable contact of the second cable transition area 382 (at a third board layer L3), along the corresponding trace, through the via 361 to the first board layer L1, and to a corresponding connector contact at the connector 250.

Each of the vias may communication between the first board layer L1 and the third board layer L3.

Vias may also be provided at other areas of the adaptor board 300. For example, vias may be provided at an area closer to the cable end of the adaptor board.

The adaptor board 300 may include any number of vias that connect contacts at the top surface (or first board layer L1) of the adaptor board 300 with corresponding contacts at the bottom surface (or third board layer L3) of the adaptor board 300.

Figure 7:
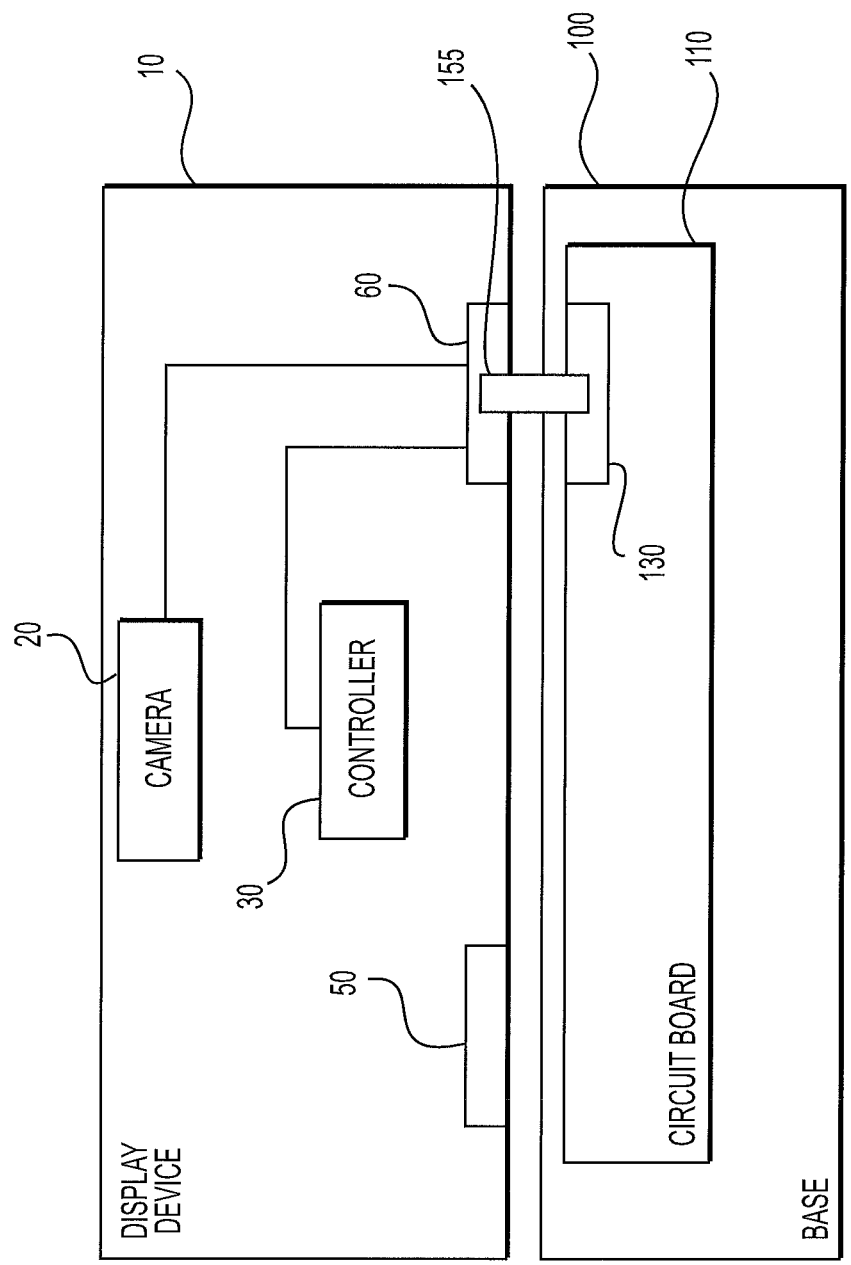
FIG. 7 is a view of an electronic system according to an example embodiment.

FIG. 7 shows an electronic system according to an example embodiment. Other embodiments and configurations may also be provided. In FIG. 7, the display device 10 may be a first part of the electronic system, and the base 100 may be a second part of the electronic system.

The electronic system of FIG. 7 generally may correspond to the electronic system of FIG. 1. The electronic system of FIG. 7 uses a connector system according to an example embodiment, and thus may result in less use of space to provide cables via the hinges. For example, data, information and power may pass through the second hinge 60, along a micro-coax cable system 155 to the FPC connector 130. An adaptor board, such as the adaptor board 300, may be coupled to the connector 130. In this embodiment, the micro-coax cable system 155 may include one or more micro-coax cables that physically connect to top and bottom surfaces of the adaptor board, such as the adaptor board 300 discussed above. For example, the micro-coax system 155 and the FPC connector 130 may correspond to the micro-coax cable system 400, the adaptor board 300 and the FPC connector 250 discussed above.

Figure 8:
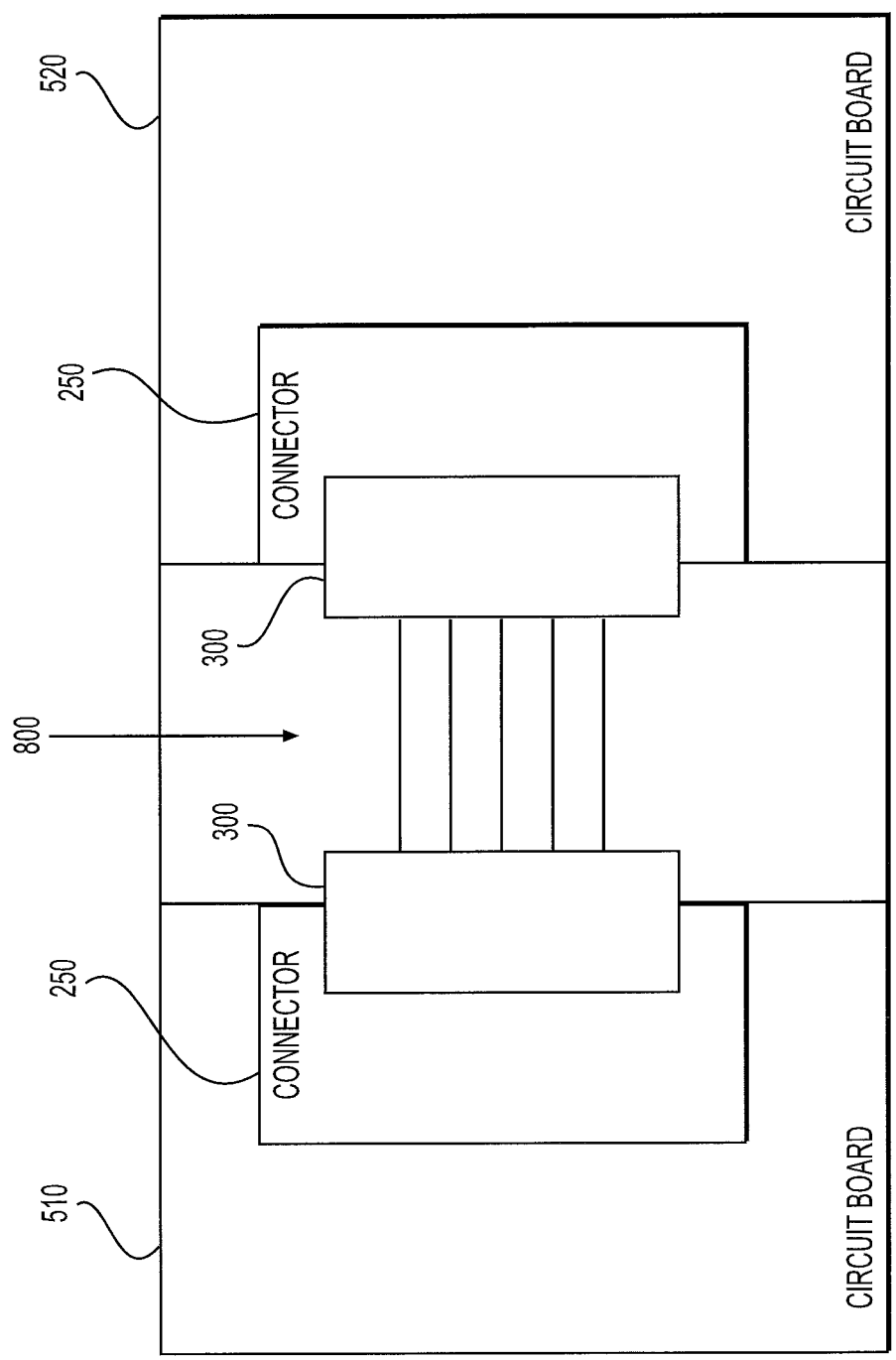
FIG. 8 is a view of two circuit boards connected by micro-coax cables according to an example embodiment.

FIG. 8 shows an electronic system according to an example embodiment. Other embodiments and configurations may also be provided.

More specifically, FIG. 8 shows a first circuit board 510 and a second circuit board 520. An FPC connector 250 may be provided on the first circuit board 610. An FPC connector 250 may be provided on the second circuit board 520.

An adaptor board, such as the adaptor board 300, may physically connect to the FPC connector 250.

An adaptor board, such as the adaptor board 300, may physically connect to the FPC connector 250.

A micro-coax cable system 800 may couple the adaptor board (on left side) to the adaptor board (on right side) using a plurality of micro-coax cables. The cables may be coupled to a top surface and a bottom surface of both of the adaptor boards.

Embodiments may provide a high speed signal transfer from board to board and/or across a hinge, for example. Embodiments may utilize an adaptor board to connect to micro-coax cables, flexible printed circuit (FPC) cable, Flat Flexible Cable (FFC) cables, and/or etc.

Embodiments may provide a high-density, high-speed FPC to micro-coax adaptor board. In at least one embodiment, the adaptor board may be a 3-layer FPC design that can support top and bottom side cable connection in order to take full advantage of FPC pins and support connector pin pitch. The adaptor board may consume less board space, reduce cost and simultaneously have good signal integrity performance and transfer double the number of high-speed differential pairs with reduced board space.

The following examples pertain to further embodiments.

Example 1 is a multi-layered adaptor board comprising: a first board layer, a second board layer under the first board layer, and a third board layer under the second board layer, the second board layer being between the first board layer and the third board layer; a first plurality of cable contacts at the first layer; a first plurality of connector contacts at the first layer; a first plurality of traces at the first board layer; a second plurality of cable contacts at the third board layer; a second plurality of connector contacts at the third board layer; and a second plurality of traces at the third board layer.

In Example 2, the subject matter of Example 1 can optionally include the first plurality of traces includes a first trace between one of the first plurality of cable contacts and one of the first plurality of connector contacts.

In Example 3, the subject matter of any one of Examples 1 and 2 can optionally include the first plurality of traces extend from a first end of the first board layer to a second end of the first board layer.

In Example 4, the subject matter of Example 1 can optionally include The multi-layered adaptor board of claim 1, wherein the second plurality of traces includes a trace between one of the second plurality of cable contacts and one of the second plurality of connector contacts.

In Example 5, the subject matter of any one of Examples 1-4 can optionally include the second plurality of traces extend from a first end of the third board layer to a second end of the third board layer.

In Example 6, the subject matter of any one of Examples 1-5 can optionally include one of the first plurality of cable contacts to contact a first wire, and one of the second plurality of cable contacts to contact a second wire.

In Example 7, the subject matter of Example 1 and Example 6 can optionally include the first wire is part of a micro-coax cable, and the second wire is part of a micro-coax cable.

In Example 8, the subject matter of any one of Examples 1-5 can optionally include one of the first plurality of connector contacts to contact a first contact at a connector, and one of the second plurality of connector contacts to contact a second contact at the connector.

In Example 9, the subject matter of Example 1 can optionally include a first via between one of the first plurality of cable contacts at the first board layer and one of the second plurality of cable contacts at the third board layer.

In Example 10, the subject matter of Example 1 can optionally include a first via between one of the first plurality of connector contacts at the first board layer and one of the second plurality of connector contacts at the third board layer.

In Example 11, the subject matter of Example 1 can optionally include a first via between one of the first plurality of traces at the first board layer and one of the second plurality of traces at the third board layer.

In Example 12, the subject matter of Example 1 and any one of Examples 9-11 can optionally include a second via between the first board layer and the third board layer.

In Example 13, the subject matter of Example 1 can optionally include the second board layer is a ground layer.

In Example 14, the subject matter of Example 1 can optionally include a layout of the second plurality of traces at the third board layer matches a layout of the first plurality of traces at the first board layer.

In Example 15, the subject matter of Example 1 can optionally include the first plurality of connector contacts corresponding to the first plurality of traces at the first board layer to contact a first connector module, and the second plurality of connector contacts corresponding to the second plurality of traces at the third board layer to contact a second connector module.

Example 16 is a connector system comprising: a connector having a first plurality of connector contacts and a second plurality of connector contacts; a multi-layered adaptor board to couple to the connector, the multi-layered adaptor board including a first board layer, a second board layer and a third board layer, the second board layer being between the first board layer and the third board layer, the multi-layered adaptor board including a first plurality of cable contacts at the first board layer, a first plurality of connector contacts at the first board layer, a second plurality of cable contacts at the third board layer and a second plurality of connector contacts at the third board layer; a first wire to contact one of the first plurality of cable contacts; and a second wire to contact one of the second plurality of cable contacts.

In Example 17, the subject matter of Example 16 can optionally include the multi-layered adaptor board includes a first plurality of traces at the first board layer.

In Example 18, the subject matter of Example 16 and Example 17 can optionally include the first plurality of traces includes a trace between one of the first plurality of cable contacts and one of the first plurality of connector contacts.

In Example 19, the subject matter of Example 16 and any one of Examples 17-18 can optionally include the first plurality of traces extend from a first end of the first board layer to a second end of the first board layer.

In Example 20, the subject matter of Example 16 and any one of Examples 17-19 can optionally include the multi-layered adaptor board includes a second plurality of traces at the third board layer.

In Example 21, the subject matter of Example 16 and Example 20 can optionally include a layout of the second plurality of traces at the third board layer matches a layout of the first plurality of traces at the first board layer.

In Example 22, the subject matter of Example 16 and Example 20 can optionally include the first plurality of connector contacts corresponding to the first plurality of traces at the first board layer to contact a first connector module of the connector, and the second plurality of connector contacts corresponding to the second plurality of traces at the third board layer to contact a second connector module of the connector.

In Example 23, the subject matter of Example 16 and Example 20 can optionally include the second plurality of traces includes a trace between one of the second plurality of cable contacts and one of the second plurality of connector contacts.

In Example 24, the subject matter of Example 16 and any one of Examples 20-21 can optionally include the second plurality of traces extend from a first end of the third board layer to a second end of the third board layer.

In Example 25, the subject matter of Example 16 can optionally include the multi-layered adaptor board includes a first via between the first board layer and the third board layer.

In Example 26, the subject matter of Example 16 and Example 25 can optionally include the first via is between one of the first plurality of cable contacts and one of the second plurality of cable contacts.

In Example 27, the subject matter of Example 16 and Example 25 can optionally include the first via is between one of the first plurality of connector contacts and one of the second plurality of connector contacts.

In Example 28, the subject matter of Example 16 and Example 25 can optionally include the first via is between a trace at the first board layer and a trace at the third board layer.

In Example 29, the subject matter of Example 16 and Example 25 can optionally include the multi-layered adaptor board includes a second via between the first board layer and the third board layer.

In Example 30, the subject matter of Example 16 can optionally include the first wire is part of a first micro-coax cable, and the second wire is part of a second micro-coax cable.

In Example 31, the subject matter of Example 16 can optionally include the second board layer is a ground layer.

In Example 32, the subject matter of Example 16 can optionally include the connector is a flexible printed circuit (FPC) connector.

In Example 33, the subject matter of Example 16 can optionally include a circuit board, and the connector to be provided on the circuit board.

Example 34 is an electronic system comprising: a first part having at least one electronic component; a second part having a circuit board and a connector, the connector at the circuit board; a hinge device to couple the first part to the second part; an adaptor board to couple to the connector at the circuit board, the adaptor board having a first board layer, a second board layer and a third board layer, the adaptor board including a first plurality of cable contacts at the first board layer, a first plurality of connector contacts at the first board layer, a second plurality of cable contacts at the first board layer and a second plurality of connector contacts at the third board layer; a first wire to contact one of the first plurality of cable contacts; and a second wire to contact one of the second plurality of cable contacts.

In Example 35, the subject matter of Example 34 can optionally include the first part is a lid having a display, and the second part is a base.

In Example 36, the subject matter of Example 34 can optionally include the adaptor board includes a first plurality of traces at the first board layer. In Example 37, the subject matter of Example 34 and Example 36 can optionally include the first plurality of traces includes a trace between one of the first plurality of cable contacts and one of the first plurality of connector contacts.

In Example 38, the subject matter of Example 34 and any one of Examples 36-37 can optionally include the first plurality of traces extend from a first end of the first board layer to a second end of the first board layer.

In Example 39, the subject matter of Example 34 and Example 36 can optionally include the adaptor board includes a second plurality of traces at the third board layer.

In Example 40, the subject matter of Example 34 and Example 39 can optionally include a layout of the second plurality of traces at the third board layer matches a layout of the first plurality of traces at the first board layer.

In Example 41, the subject matter of Example 34 and Example 39 can optionally include the first plurality of connector contacts corresponding to the first plurality of traces at the first board layer to contact a first connector module of the connector, and the second plurality of connector contacts corresponding to the second plurality of traces at the third board layer to contact a second connector module of the connector.

In Example 42, the subject matter of Example 34 and Example 39 can optionally include the second plurality of traces includes a trace between one of the second plurality of cable contacts and one of the second plurality of connector contacts.

In Example 43, the subject matter of Example 34 and any one of Examples 39-40 can optionally include the second plurality of traces extend from a first end of the third board layer to a second end of the third board layer.

In Example 44, the subject matter of Example 34 can optionally include the first wire is part of a first micro-coax cable, and the second wire is part of a second micro-coax cable.

In Example 45, the subject matter of Example 34 can optionally include the adaptor board includes a first via between the first board layer and the third board layer.

In Example 46, the subject matter of Example 34 and Example 45 can optionally include the first via is between one of the first plurality of cable contacts and one of the first plurality of connector contacts.

In Example 47, the subject matter of Example 34 and Example 45 can optionally include the first via is between one of the first plurality of connector contacts and one of the second plurality of connector contacts.

In Example 48, the subject matter of Example 34 and Example 45 can optionally include the first via is between a trace at the first board layer and a trace at the third board layer.

In Example 49, the subject matter of Example 34 and Example 45 can optionally include the adaptor board includes a second via between the first board layer and the third board layer.

In Example 50, the subject matter of Example 34 can optionally include wherein the second board layer is a ground layer.

In Example 51, the subject matter of Example 34 can optionally include the connector is a flexible printed circuit (FPC) connector.

Any reference in this specification to "one embodiment," "an embodiment," "example embodiment," etc., means that a particular feature, structure, or characteristic described in connection with the embodiment is included in at least one embodiment. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A multi-layered adaptor board comprising:
    a first board layer, a second board layer under the first board layer, and a third board layer under the second board layer, the second board layer being between the first board layer and the third board layer;
    a first plurality of cable contacts at the first layer;
    a first plurality of connector contacts at the first layer;
    a first plurality of traces at the first board layer;
    a second plurality of cable contacts at the third board layer;
    a second plurality of connector contacts at the third board layer;
    a second plurality of traces at the third board layer; and
    a first via coupled between one of the first plurality of connector contacts at the first board layer and one of the second plurality of connector contacts at the third board layer.

2. The multi-layered adaptor board of claim 1, wherein the first plurality of traces includes a first trace between one of the first plurality of cable contacts and one of the first plurality of connector contacts.

3. The multi-layered adaptor board of claim 1, wherein one of the first plurality of cable contacts to contact a first wire, and one of the second plurality of cable contacts to contact a second wire.

4. The multi-layered adaptor board of claim 3, wherein the first wire is part of a micro-coax cable, and the second wire is part of a micro-coax cable.

5. The multi-layered adaptor board of claim 1, wherein one of the first plurality of connector contacts to contact a first contact at a connector, and one of the second plurality of connector contacts to contact a second contact at the connector.

6. The multi-layered adaptor board of claim 1, further comprising a second via coupled between one of the first plurality of cable contacts at the first board layer and one of the second plurality of cable contacts at the third board layer.

7. The multi-layered adaptor board of claim 1, wherein the first via is directly coupled to one of the first plurality of connector contacts at the first board layer, and the first via is directly coupled to the one of the second plurality of connector contacts at the third board layer.

8. The multi-layered adaptor board of claim 1, further comprising a second via between one of the first plurality of traces at the first board layer and one of the second plurality of traces at the third board layer.

9. The multi-layered adaptor board of claim 1, wherein a layout of the second plurality of traces at the third board layer matches a layout of the first plurality of traces at the first board layer.

10. The multi-layered adaptor board of claim 1, wherein the first plurality of connector contacts corresponding to the first plurality of traces at the first board layer to contact a first connector module, and
    the second plurality of connector contacts corresponding to the second plurality of traces at the third board layer to contact a second connector module.

11. A connector system comprising:
    a connector having a first plurality of connector contacts and a second plurality of connector contacts;
    a multi-layered adaptor board to couple to the connector, the multi-layered adaptor board including a first board layer, a second board layer and a third board layer, the second board layer being between the first board layer and the third board layer, the multi-layered adaptor board including a first plurality of cable contacts at the first board layer, a first plurality of connector contacts at the first board layer, a second plurality of cable contacts at the third board layer and a second plurality of connector contacts at the third board layer, wherein the multi-layered adaptor board includes a first via coupled between one of the first plurality of connector contacts at the first board layer and one of the second plurality of connector contacts at the third board layer;
    a first wire to contact one of the first plurality of cable contacts; and
    a second wire to contact one of the second plurality of cable contacts.

12. The connector system of claim 11, wherein the multi-layered adaptor board includes a first plurality of traces at the first board layer.

13. The connector system of claim 12, wherein the first plurality of traces includes a trace between one of the first plurality of cable contacts and one of the first plurality of connector contacts.

14. The connector system of claim 11, wherein the multi-layered adaptor board includes a second via between the first board layer and the third board layer.

15. An electronic system comprising:
    a first part having at least one electronic component;
    a second part having a circuit board and a connector, the connector at the circuit board;
    a hinge device to couple the first part to the second part;
    an adaptor board to couple to the connector at the circuit board, the adaptor board having a first board layer, a second board layer and a third board layer, the adaptor board including a first plurality of cable contacts at the first board layer, a first plurality of connector contacts at the first board layer, a second plurality of cable contacts at the first board layer and a second plurality of connector contacts at the third board layer;

a first wire to pass through the hinge device and to contact one of the first plurality of cable contacts; and a second wire to pass through the hinge device and to contact one of the second plurality of cable contacts.

16. The electronic system of claim 15, wherein the first part is a lid having a display, and the second part is a base.

17. The electronic system of claim 15, wherein the adaptor board includes a first plurality of traces at the first board layer.

18. The electronic system of claim 16, wherein the first plurality of traces includes a trace between one of the first plurality of cable contacts and one of the first plurality of connector contacts.

19. The electronic system of claim 15, wherein the adaptor board includes a first via between the first board layer and the third board layer.

20. The electronic system of claim 19, wherein the first via is coupled between one of the first plurality of connector contacts and one of the second plurality of connector contacts.

* * * * *